United States Patent

Quinsat et al.

(10) Patent No.: US 8,655,302 B2
(45) Date of Patent: Feb. 18, 2014

(54) DEMODULATOR OF A FREQUENCY-MODULATED ELECTRICAL SIGNAL

(75) Inventors: Michaël Quinsat, Grenoble (FR); Marie-Claire Cyrille, Sinard (FR); Ursula Ebels, Grenoble (FR); Jean-Philippe Michel, Fontaine (FR)

(73) Assignee: Commissariat a l'Energie Atomique et aux Energies Alternatives, Paris (FR)

(*) Notice: Subject to any disclaimer, the term of this patent is extended or adjusted under 35 U.S.C. 154(b) by 0 days.

(21) Appl. No.: 13/449,644

(22) Filed: Apr. 18, 2012

(65) Prior Publication Data

US 2012/0270515 A1   Oct. 25, 2012

(30) Foreign Application Priority Data

Apr. 20, 2011   (FR) ...................... 11 53421

(51) Int. Cl.
*H04B 1/16* (2006.01)
(52) U.S. Cl.
USPC ................. 455/339; 455/550.1; 360/324
(58) Field of Classification Search
USPC ............. 455/337, 293, 339, 550.1; 360/324
See application file for complete search history.

(56) References Cited

U.S. PATENT DOCUMENTS

| 5,695,864 | A  | 12/1997 | Slonczewski |
| 2010/0097730 | A1 | 4/2010 | Asatani |
| 2010/0296203 | A1 | 11/2010 | Kawakami et al. |
| 2011/0051481 | A1 | 3/2011 | Maehara |

FOREIGN PATENT DOCUMENTS

| EP | 1860769 | 11/2007 |
| FR | 2817998 | 6/2002 |
| FR | 2892871 | 5/2007 |
| FR | 0 957 888 | 5/2011 |

OTHER PUBLICATIONS

Baibich, M., Broto, J.M., Fert, A., Nguyen Van Dau, F., Petroff, F., Etienne, P., Creuzet, G., Friederch, A. and Chazelas, J., "*Giant magnetoresistance of (001)Fe/(001)Cr magnetic superlattices*", Phys.Rev.Lett., 61 (1988) 2472.

Katine, J.A., Albert, F.J., Buhrman, R.A., Myers, E.B., and Ralph, D.C., "*Current-Driven Magnetization Reversal and Spin-Wave Excitations in Co /Cu /Co Pillars*", Phys. Rev. Lett. 84, 3149 (2000).

Kiselev, S.I., Sankey, J.C., Krivorotov, LN., Emley, N.C., Schoelkopf, R.J., Buhrman, R.A., and Ralph, D.C., "*Microwave oscillations of a nanomagnet driven by a spin-polarized current*", Nature, 425, 380 (2003).

Moodera, JS., Kinder, LR., Wong, TM. and Meservey,R. "*Large magnetoresistance at room temperature in ferromagnetic thin film tunnel junctions*", Phys.Rev.Lett 74 , (1995) 3273-6.

(Continued)

*Primary Examiner* — Creighton Smith
(74) *Attorney, Agent, or Firm* — Occhiuti & Rohlicek LLP (57) ABSTRACT

A demodulator of an FM signal modulated about a carrier frequency with a modulation frequency has an RF oscillator configured to be synchronized, under identical conditions of operation, with oscillations at first and second frequencies used in the FM signal to encode respective pieces of information. The oscillator has a magnetoresistive device; and a low-pass filter connected to an output electrode of the magnetoresistive device to filter an oscillating signal, generated by the oscillator and to a rendering terminal to provide, as a demodulated electrical signal, the filtered signal, the cut-off frequency $f_c$ at −3 dB of this filter being strictly lower than the frequency and higher than the modulation frequency.

10 Claims, 3 Drawing Sheets

(56) References Cited

OTHER PUBLICATIONS

Sergei Urazhdin and Phillip Tabor, *"Fractional synchronization of spin-torque nano-oscillators"*, Physical Review Letters, PRL 105, 104101, Sep. 3, 2010.

Slavin and V. Tiberkevich, *"Nonlinear auto-oscillator theory of microwave generation by spin-polarized current"* IEEE Transaction on Magnetics, vol n°45, pp. 1875-1918(2009).

Yamaguchi et al : "Self-homodyne rf demodulator using ferromagnetic nanowire", Applied Physics Letters, AIP, American Institute of Physics, Melville, NY, US, vol. 90, n°21, May 22, 2007, pp. 212505-212505.

DEMODULATOR OF A FREQUENCY-MODULATED ELECTRICAL SIGNAL

RELATED APPLICATIONS

Under 35 USC 119, this application claims the benefit of the priority date of French Patent Application 1153421, filed Apr. 20, 2011, the contents of which are herein incorporated by reference.

BACKGROUND OF THE INVENTION

The invention pertains to a demodulator of an electrical signal that is frequency-modulated about a carrier frequency $f_p$ with a modulation frequency $f_m$. An object of the invention is also a method for demodulating a frequency-modulated electrical signal of this kind.

In frequency-modulated electrical signals, a piece of information is encoded on a frequency. For example, such signals are sent or received by a portable telephone or a radio system.

PRIOR ART

There is therefore a very large number of demodulators used at the present time to demodulate these signals. For example, the following different types of demodulators are known:
  in-phase quadrature demodulators,
  synchronous demodulators,
  etc.

All these known demodulators comprise:
  an acquisition terminal at which the frequency-modulated signal is received, and
  a rendering terminal at which the frequency-demodulated electrical signal is rendered.

However, all these known demodulators have the common feature of being bulky and, often, complex.

Prior art is also known from:
US2011/051481A1,
US20101296203A1,
US20101097730A1,
Yamaguchi et al: "Self-homodyne rf demodulator using ferromagnetic nanowire", Applied Physics Letters, AIP, American Institute of Physics, Melville, N.Y., US, Vol. 90, no 21, 22 May 2007, pages 212505-212505.

SUMMARY OF THE INVENTION

The invention seeks to overcome this drawback by proposing a less bulky demodulator.

An object of the invention therefore is a demodulator comprising:
  a radiofrequency oscillator comprising:
  a magnetoresistive device within which there flows a spin-polarized electrical current to generate an oscillating signal at an output electrode, this device being formed by a stack of magnetic layers and non-magnetic layers, for which the amplitude of the variations of its resistance varies as a function of the frequency of the oscillating signal produced,
  a current source to make a continuous current of electrons flow in said layers perpendicularly to them or a magnetic field generator capable of generating a continuous magnetic field, the field lines of which cross the free layer of the magnetoresistive device with an intensity greater than or equal to 1 Oe, the current source and/or the continuous magnetic field generator being set so that, under identical conditions of operation, the radiofrequency oscillator gets synchronized with oscillations at a frequency $f_1$ and in alternation with oscillations at a frequency $f_2$, where the frequencies $f_1$ and $f_2$ are frequencies used in the frequency-modulated signal to encode respective pieces of information, and
  a synchronization terminal for synchronizing the frequency of the oscillating signal with the frequency of the signal received at this terminal, this terminal being connected to the acquisition terminal, and
  a low-pass filter connected:
  to the output electrode of the magnetoresistive device to filter the oscillating signal, and
  to the rendering terminal to provide, as a demodulated electrical signal, the filtered signal, the cut-off frequency $f_c$ at −3 dB of this filter being strictly lower than the frequency $f_p$ and higher than the frequency $f_m$.

The above demodulator uses chiefly a magnetoresistive device whose output electrode is connected to a low-pass filter. Magnetoresistive devices are particularly compact devices for converting a frequency-modulated signal into an amplitude-modulated signal. Indeed, they generally have a cross-section smaller than 10 μm² and a thickness of a few micrometers (smaller than 10 μm). Thus, through the use of the magnetoresistive device in the above demodulator, the space requirement of the demodulator is reduced.

The embodiments of this demodulator may include one or more of the following characteristics:
  the stack of layers of the magnetoresistive devices comprises at least the following layers:
    an input electrode by which a direct electrical current is injected,
    a first magnetic layer, called a "reference layer" capable of spin-polarizing the electrical current, and the magnetization of which has a fixed direction,
    a second magnetic layer, called a "free layer", the magnetization of which can oscillate when it is crossed by the spin-polarized current,
    a non-magnetic layer, called a "spacer", interposed between the two previous layers to form a tunnel junction or a spin valve, and
    the output electrode at which there is produced the signal oscillating at an oscillating frequency as a function of the intensity of the direct current or of the amplitude of a continuous magnetic field, the field lines of which cross the free layer,
    the cross-section of at least one of the layers of this stack having a diameter of less than 300 nm;
  the radiofrequency oscillator is configured to produce a signal oscillating at the frequencies $\alpha f_1$ and $\alpha f_2$ when the radiofrequency oscillator is synchronized with the oscillations having frequencies respectively of $f_1$ and $f_2$, where $\alpha$ has a value strictly greater than one;
  the radiofrequency oscillator has a magnetic field generator equipped with the synchronization terminal, this generator being capable of generating an alternating magnetic field, the frequency of which is a function of the frequency of the signal received at the synchronization terminal, and the field lines of which cross the free layer so that the frequency of the oscillating signal gets synchronized with the frequency of the signal received at the synchronization terminal;
  the radiofrequency oscillator comprises a summer or summing element equipped with the synchronization terminal, this summing element being capable of adding the electrical signal received at the synchronization terminal to the direct current that crosses said layers perpendicularly to them so that the frequency of the oscillating signal gets synchronized with the frequency of the signal received at the synchronization terminal.

These embodiments of the demodulator furthermore have the following advantage:

using a radiofrequency oscillator synchronizable with the frequencies $\alpha f_1$ and $\alpha f_2$, where $\alpha$ is strictly greater than 1, increases the sensitivity of the demodulator.

An object of the invention is also a method for demodulating an electrical signal frequency-modulated about a carrier signal $f_p$ with a modulation frequency $f_m$, this method comprising:

the reception, at an acquisition terminal, of the modulated electrical signal, and the rendering, at a rendering terminal, of the demodulated electrical signal.

This method also comprises:

the synchronizing of a radiofrequency oscillator, under identical conditions of operation, with oscillations of frequency $f_1$ and, in alternation, with oscillations of frequency $f_2$, where the frequencies $f_1$ and $f_2$ are frequencies used in the frequency-modulated signal to encode respective pieces of information, this radiofrequency oscillator comprising:

a magnetoresistive device within which there flows a spin-polarized electrical current to generate an oscillating signal at an output electrode, this device being formed by a stack of magnetic layers and non-magnetic layers, for which the amplitude of the variations of its resistance varies as a function of the frequency of the oscillating signal produced, a current source to make a continuous current of electrons flow in said layers perpendicularly to them or a magnetic field generator capable of generating a continuous magnetic field, the field lines of which cross the free layer of the magnetoresistive device with an intensity greater than or equal to 1 Oe, the current source and/or the continuous magnetic field generator being set so that, under identical conditions of operation, the radiofrequency oscillator gets synchronized with oscillations at a frequency $f_1$ and, in alternation, with oscillations at a frequency $f_2$, and a synchronization terminal for synchronizing the frequency of the oscillating signal with the frequency of the signal received at this terminal, this terminal being connected to the acquisition terminal, the filtering, by means of a low-pass filter, of the oscillating signal generated at the output electrode and the providing of the filtered signal to the rendering terminal as a demodulated electrical signal, the cut-off frequency $f_c$ at −3 dB of this filter being strictly lower than the frequency $f_p$ and higher than the frequency $f_m$.

The embodiments of this method may comprise one or more of the following characteristics:

the direct current and/or a continuous magnetic field are set so that the free frequency $f_{lo}$ of oscillation of the oscillation signal produced in the absence of a signal at the synchronization terminal is between the frequencies $\alpha f_1$ and $\alpha f_2$, where the frequencies $f_1$ and $f_2$ are respectively the lowest and the highest of the frequencies used in the frequency-modulated signal to encode a piece of information and $\alpha$ is a rational number;

the frequency-modulated electrical signal is amplified so that the extent of the range, about the signal $f_p$, of the frequencies with which the radiofrequency oscillator can get synchronized is strictly greater than $|f_1-f_2|$, where $|\ldots|$ is the absolute value;

the frequency-modulated electrical signal is amplified so that its amplitude at the synchronization terminal is greater than 10% of the intensity of the direct current or corresponds to an alternating magnetic field, the intensity of which is greater than 1 Oe within the free layer when it is converted into a magnetic field by a generator;

the modulation frequency $f_m$ is strictly lower than a frequency $\Gamma_c$, where $\Gamma_c$ is the rate of relaxation of amplitude of the magnetoresistive device.

BRIEF DESCRIPTION OF THE DRAWINGS

The invention will be understood more clearly from the following description, given purely by way of a non-exhaustive example and made with reference to the drawings of which.

MORE DETAILED DESCRIPTION

In these figures, the same references are used to designate the same elements.

Here below in this description, the characteristics and functions well known to those skilled in the art are not described in detail.

Figure 1:
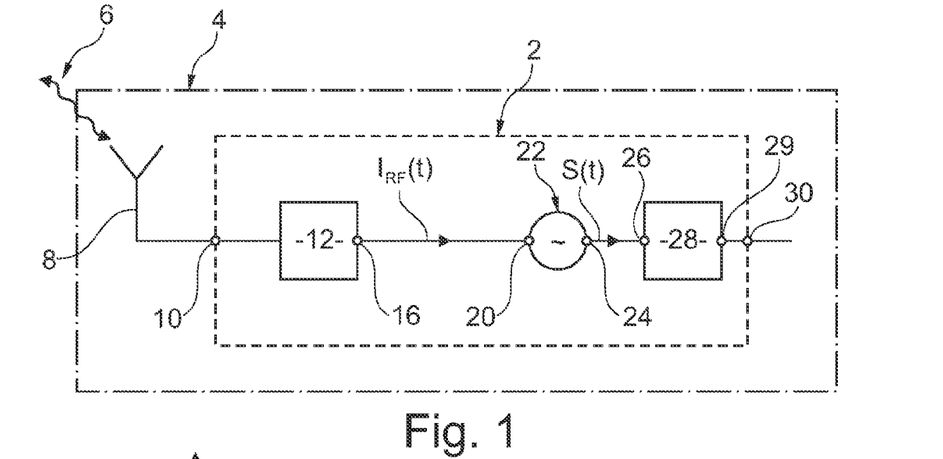
FIG. 1 is a schematic illustration of a demodulator of a frequency-modulated electrical signal.

FIG. 1 shows a demodulator 2 of a frequency-modulated electrical signal. Here, the demodulator 2 is described in the particular case where it forms part of an apparatus 4 capable of receiving the frequency-modulated signal through a wireless link 6. For example, the apparatus 4 is a portable telephone and the link 6 is a radio link.

The apparatus 4 is equipped with an antenna 8 to set up the wireless link 6. The antenna 8 converts the radio signal into an electrical signal that is transmitted to a terminal 10 for acquisition of the electrical signal of the demodulator 2. Between the antenna 8 and the terminal 10, the apparatus 4 can have different electronic blocks that have not been shown in order to simplify FIG. 1.

In the signal received by the antenna 8, the pieces of information are encoded by frequency-modulating a carrier by means of the pieces of information to be received. Here, the modulation used is known as FSK (frequency shift keying).

The demodulator 2 has a block 12 for shaping the frequency-modulated electrical signal. This block 12 enables the adjusting of the amplitude of the frequency-modulated signal. To this end, it has especially an amplifier. Here, the block 12 also enables the improvement of the signal-to-noise ratio of the received signal.

The shaped signal generated by the block 12 is rendered at an output 16. This signal is an electrical current denoted as $I_{RF}(t)$. This signal $I_{RF}(t)$ is represented as a function of the time t on the timing diagram of FIG. 2.

Figure 2:
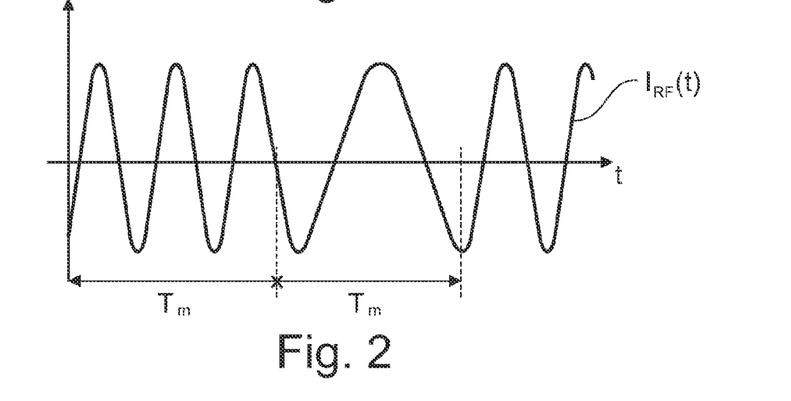
FIG. 2 is a partial timing diagram of a frequency-modulated signal.

This signal $I_{RF}(t)$ uses only two frequencies $f_1$ and $f_2$ to encode the information to be transmitted. Here, by convention, it shall be considered that the frequencies $f_1$ and $f_2$ are used to encode information bits or states equal respectively to "0" and to "1".

The frequencies $f_1$ and $f_2$ are centered on a carrier frequency $f_p$. For example, the frequency $f_p$ is defined by the following relationship: $f_p=(f_1+f_2)/2$.

Typically, the frequency $f_p$ is a radiofrequency signal, i.e. a signal whose frequency ranges from 100 MHz to 60 or 120 GHz and preferably from 700 MHz to 40 GHz.

The depth of modulation of the signal $I_{RF}(t)$ is greater than 100 kHz and preferably greater than 100 MHz. The depth of modulation is the difference between the frequencies $f_1$ and $f_2$. For example here, the depth of modulation is 200 MHz.

In FIG. 2, the duration of modulation for transmitting an information bit is denoted as $T_m$. This duration $T_m$ corresponds to a modulation frequency $f_m$ given by the following relationship: $f_m=1/T_m$. The frequency $f_m$ is generally lower than twice the frequency $f_p$ of the carrier. Here, the frequency $f_m$ is lower than or equal to 10 MHz and higher than or equal to 2 MHz.

The output 16 is directly connected to a synchronization terminal 20 of a radiofrequency oscillator 22. This oscillator 22 produces an oscillating signal s(t) at an output electrode 24. The electrode 24 is directly connected to the input 26 of a low-pass filter 28. An output 29 of this low-pass filter is directly connected to a rendering terminal 30 at which the demodulator 2 renders the frequency-demodulated electrical signal. The electrode 24 is therefore connected here to the terminal 26 solely by means of the filter 28.

The cut-off frequency $f_c$ of the filter 28 at −3 dB is strictly lower than the frequency $f_p$ of the carrier. The frequency $f_c$ is also higher than or equal to the modulation frequency $f_m$. Preferably, the frequency $f_c$ is higher than or equal to the frequency $f_m$ and strictly lower than twice the frequency $f_p$.

In FIG. 2, two periods $T_m$ have been shown. In the first period $T_m$, the carrier is modulated with the frequency $f_1$ while, at the second period, the carrier is modulated with the frequency $f_2$.

Advantageously, whatever the information bit encoded, the amplitude of the signal $I_{RF}(t)$ is substantially constant. The term "substantially constant" designates the fact that the amplitude of the oscillations during any two unspecified successive periods $T_m$ are equal to within ±5% and preferably to within ±1%.

The quality factor of the oscillations at each period $T_m$ is good. The term "quality factor" designates the following ratio:

$$Q=f_t/\Delta f$$

where:
Q is the quality factor,
$f_t$ is the frequency of the oscillations, and
$\Delta f$ is the width at mid-height of the line centered on the frequency $f_t$ in the power spectrum of these oscillations.

A quality factor is considered to be good if it is greater than 1000 or even 10000.

Figure 3:
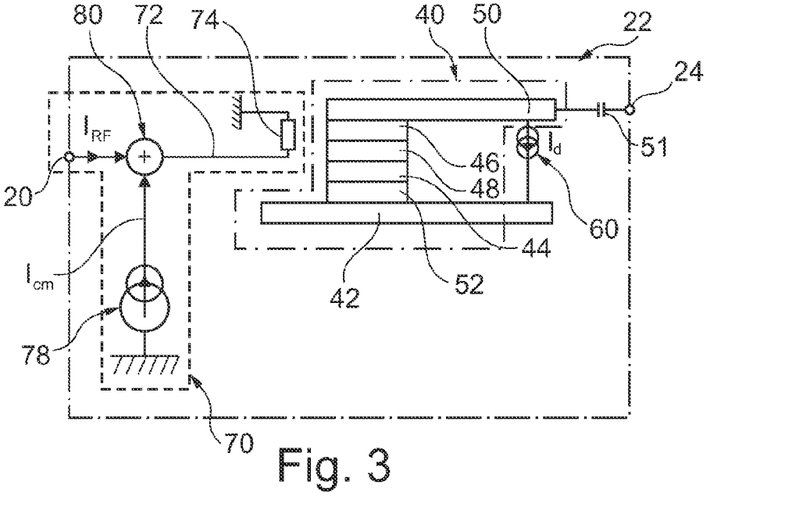
FIG. 3 is a schematic illustration of a radiofrequency oscillator used in the demodulator of FIG. 1.

FIG. 3 gives a more detailed view of an example of an embodiment of the oscillator 22. This oscillator 22 is derived from spin electronics.

Spin electronics uses the spin of electrons as an additional degree of freedom in order to generate novel effects. The spin polarization of an electrical current results from the asymmetry existing between the spin-up type of polarization of the conduction electrons (i.e. polarization parallel to the local magnetization) and the spin-down type polarization (i.e. polarization anti-parallel to the local magnetization). This asymmetry leads to an asymmetry in the conductivity between the two channels, namely the spin-up and spin-down channels, giving rise to a distinct spin polarization of the electrical current.

This spin polarization of the current is the source of the magnetoresistive phenomena in magnetic multi-layers such as giant magnetoresistance (Baibich, M., Broto, J. M., Fert, A., Nguyen Van Dau, F., Petroff, F., Etienne, P., Creuzet, G., Friederch, A. and Chazelas, J., "*Giant magnetoresistance of (001)Fe/(001)Cr magnetic superlattices*", Phys. Rev. Lett., 61 (1988) 2472), or tunnel magnetoresistance (Moodera, J S., Kinder, L R., Wong, T M. and Meservey, R. "*Large magnetoresistance at room temperature in ferromagnetic thin film tunnel junctions*", Phys. Rev. Lett 74, (1995) 3273-6).

Furthermore, it has also been observed that by making a spin-polarized current cross a thin magnetic layer, it is possible to induce a reversal of its magnetization where there is no external magnetic field (Katine, J. A., Albert, F. J., Buhrman, R. A., Myers, E. B., and Ralph, D. C., "*Current-Driven Magnetization Reversal and Spin-Wave Excitations in Co/Cu/Co Pillars*", Phys. Rev. Lett. 84, 3149 (2000)).

Polarized current can also generate sustained magnetic excitations, also known as oscillations (Kiselev, S. I., Sankey, J. C., Krivorotov, L N., Emley, N. C., Schoelkopf, R. J., Buhrman, R. A., and Ralph, D. C., "*Microwave oscillations of a nanomagnet driven by a spin-polarized current*", Nature, 425, 380 (2003)). The use of the effect of the generation of sustained magnetic excitations in a magnetoresistive device makes it possible to convert this effect into a modulation of electrical resistance directly usable in electronic circuits. The patent applications U.S. Pat. No. 5,695,864 and EP1 860 769 describe various developments implementing the physical principle mentioned here above. They describe especially the precession of the magnetization of a magnetic layer crossed by a spin-polarized electrical current. The physical principles implemented as well as the terminology used are also described and defined in the patent application FR2 892 871.

The oscillation frequency of these radiofrequency oscillators is adjusted by playing on the intensity of the current that goes through them and additionally, if necessary, on an external magnetic field.

Since these radiofrequency oscillators are known, only the elements needed for an understanding of the working of the demodulator 2 are described in greater detail.

The oscillator 22 comprises a magnetoresistive device 40. This device 40 is formed by a stack of magnetic and non-magnetic layers. This stack may form:

a tunnel junction also known as a TMR (tunnel magnetoresistance) junction, or a spin valve also known as GMR (giant magnetoresistance) spin valve.

Here, the device 40 is described in the particular case where the stack forms a tunnel junction. To this end, the stack comprises at least the following layers:

an input electrode 42 into which there is injected a direct electrical current $I_d$, a magnetic layer 44 called a "reference layer" that is capable of spin-polarizing the electrical current injected into the electrode 42 and the magnetization of which has a fixed direction, a magnetic layer 46, called a "free layer", the magnetization of which can oscillate when it is crossed by the spin-polarized current, a non-magnetic layer 48, called a spacer, interposed between the two preceding layers to create the tunnel junction, and an output electrode 50 at which the oscillating signal s(t) is produced.

To produce a high current density, the cross-section of at least one of the layers of the stack typically has a diameter of less than 300 nm and preferably less than 200 or 100 nm. When the cross-section is not a disk, the term "diameter" must be understood to mean "hydraulic diameter". Typically, the term "high" current density designates a current density greater than $10^6$ A/cm$^2$ or $10^7$ A/cm$^2$.

This magnetoresistive device 40 is conformated according to a geometry known as CPP (current perpendicular to plane) geometry. More specifically, in FIG. 2, the magnetoresistive device adopts a structure known as the "nanopillar" structure. In this structure, the layers between the electrodes 42 and 50 have the same horizontal section.

The width L of the different layers forming the pillar is constant. Here, the width L typically ranges from 20 nm to 200 nm.

The electrodes 42 and 50 make it possible to convey the current that crosses the different layers forming the magnetic device perpendicularly to the plane of these layers. The electrode 50 is connected to the electrode 54 by means of a capacitor 51.

The layers 44, 46 and 48 are laid out and conformated so as to enable the appearance of the magnetoresistive properties, i.e. a variation of the resistance of the pillar as a function of the directions of magnetization of the layers 44 and 46.

To improve the readability of FIG. 1, the proportions between the thicknesses of the different layers have not been maintained.

The reference layer 44 is made out of an electrically conductive magnetic material. Its upper face is in direct contact with the spacer 48. It has a direction of easier magnetization contained in the plane of the layer.

The reference layer 44 has the function of spin-polarizing the electrons of the current that cross it. It therefore has a sufficient thickness to achieve this function.

For example, the reference layer 44 is made out of cobalt (Co), nickel (Ni), iron (Fe) and their alloy (CoFe, NiFe, CoFeB . . . etc.). The thickness of the reference layer 44 is of the order a few nanometers. The reference layer 44 may be laminated by the insertion of a few (typically 2 to 4) very thin layers of copper, silver or gold with a thickness of about 0.2 to 0.5 nm to reduce the spin diffusion length.

Here, the reference layer 44 has a magnetization of fixed direction. The term "magnetization of fixed direction" designates the fact that the direction of the magnetic moment of the reference layer 44 is more difficult to modify than the direction of the magnetic moment of the free layer 46. To obtain this here, the magnetization of the reference layer 44 is trapped by an anti-ferromagnetic conductive layer 52 interposed between the reference layer 44 and the electrode 42. The upper face of the layer 42 is in direct contact with the lower face of the reference layer 44.

Typically, the thickness of the layer 52 ranges from 5 to 50 nm. It can be made out of a manganese alloy such as one of the following alloys IrMn, PtMn, FeMn, etc. for example, this layer 52 is made out of a material chosen from the group comprising IrMn, FeMn, PtMn, NiMn.

The spacer 48 is a non-magnetic layer. This spacer 48 is thin enough to enable the spin-polarized current to pass from the reference layer 44 to the free layer 46 in limiting polarization loss. Conversely, the thickness of this spacer 48 is great enough to provide for magnetic uncoupling between the layers 44 and 46.

The spacer 48 is made out of an insulating material such as an oxide or an aluminum nitrite, a magnesium oxide, a tantalum nitrite, strontium titanate (SrTiO$_3$), etc. The pillar then has tunnel magnetoresistive or TMR properties and the spacer 48 forms a tunnel barrier. In this case, the thickness of the spacer 48 typically ranges from 0.5 nm to 3 nm.

Here, the tunnel barrier of the device 40 is thin in order to have a low RA factor, i.e. a factor ranging from 0.1 to 20 $\Omega\mu m^2$, and advantageously below 10 or even 5 $\Omega\mu m^2$. The RA factor of a tunnel barrier is the product of the resistance of the tunnel barrier multiplied by its area. Here, the area is the surface area of the cross-section of the tunnel barrier.

Generally, the higher the RA factor of the tunnel barrier, the higher will be the range of variation of the resistivity of the tunnel junction (for example it will be higher than 10%) and the better will be the sensitivity of the tunnel junction to the precession of the magnetization in the free layer. Typically, for RA factor values of this order, it is generally easy to generate oscillations and it is possible to obtain TMR values ranging from 20% to 150% of the RA factor (typically 80% of the RA factor for an RA factor of 1 $\Omega\mu m^2$), making it possible to obtain high sensitivity of the tunnel junction to precession of the magnetization in the free layer.

The free layer 46 is an electrically conductive magnetic layer, the magnetization of which can rotate or "precess" more easily than the magnetization of the reference layer 44.

Many embodiments of the free layer are possible. For example, possible embodiments of this free layer are described in the patent application filed under number FR 0 957 888 and in the patent application published under number FR2 892 871.

The lower face of the layer 46 is in direct contact with the upper face of the spacer 48. The upper face for its part is in direct contact with the electrode 50. This layer 46 is made for example out of a ferromagnetic material such as cobalt, nickel or iron or an alloy of these different metals (for example CoFe, CoFeB, NiFe, etc.).

In the absence of spin-polarized current and of any external magnetic field, the direction M of the total magnetic moment of the layer 46 is oriented in parallel to the plane of this layer. The direction M then corresponds to the direction of easiest magnetization of the free layer.

Typically, this stack of layers is made on the upper face of a substrate not shown herein.

Preferably, the magnetoresistive device 40 is highly non-linear. The term "highly non-linear" designates the fact that the derivative, denoted as $df_{lo}/dA$, of the free frequency $f_{lo}$ of the device 40 as a function of the amplitude A of the variations of the resistance of the device 40, is greater than 10 MHz/$\Omega$ across the range of operation of the oscillator 22.

The device 40 works as a spin transfer oscillator or STO when the intensity of the spin-polarized direct current $I_d$ crosses a threshold $I_c$ known as a "critical current of oscillation". When the intensity of the current $I_d$ crosses this threshold $I_c$, the magnetization of the free layer of the device 40 precesses sustainedly. The signal s(t) then oscillates at the free frequency $f_{lo}$. Typically, the threshold $I_c$ corresponds to a current density greater than $10^7$ A/cm$^2$ in the cross-section of the layers of the stack. If not, the device 40 behaves like a resonator also known as an STR (spin transfer resonator), and the oscillating signal generated is dampened and not sustained. However, even in this case, to generate the dampened oscillating signal, the current density in the cross-section of the layers of the stack must be high.

To generate the direct current $I_d$, the oscillator 22 has a direct current source 60. In this embodiment, the source 60 generates a direct current $I_d$ the intensity of which is above the threshold $I_c$. Thus, here below in this description, the device 40 works like a spin transfer oscillator. For example, the source 60 is connected between the electrodes 42 and 50.

To set the free frequency $f_{lo}$ of oscillation of the signal s(t) generated by the device 40, here the oscillator 22 is also equipped with a generator 70 of a continuous or constant magnetic field $H_b$. This generator 70 is laid out relatively to the device 40 in a way such that these lines of the magnetic field $H_b$ cross the free layer 46. For example, this generator 70 takes the form of a conductive track 72 powered with direct current $I_{cm}$ by a current source 78. The track 72 is placed in proximity to the stack of the layers of the device 40. For example, this track 72 is laid out relatively to the layer 46 so that the magnetic field lines generated are parallel to the direction M of easiest magnetization of the layer 46. Preferably, to limit the electrical consumption of the generator 70, the shortest distance between this conductive track 72 and the free layer 46 is smaller than 100 μm and advantageously smaller than 10 μm or even 1 μm. In FIG. 3, the resistivity of this track 72 is represented by a resistor 74. For example, the resistance value 74 is equal to 10Ω and corresponds to the resistance of the conductive track 72 between the output of the source 78 and a reference potential such as ground.

The generator 70 has a summing element 80, one input of which is directly connected to the synchronization terminal 20 and the other input of which is directly connected to the output of the source 78 of the direct current $I_{cm}$. The output of this summing element 80 is directly connected to the track 72. This enables the generation, in addition to the magnetic field $H_b$, of an alternating magnetic field $H_a$, the frequency of which is equal to that of the signal $I_{RF}(t)$.

The oscillation signal of the oscillator 22 is denoted as $f_o$. When there is no signal at the terminal 20, this frequency $f_o$ is equal to the free frequency $f_{lo}$ of oscillation of the oscillator 22. The free frequency is a function of the field $H_b$ and of the intensity of the current $I_d$. When an oscillating signal is received at the terminal 20, the oscillator 22 can get synchronized with this oscillating signal. When the oscillator 22 is synchronized, it produces an oscillating signal s(t) which oscillates in phase with the signal received at the terminal 20. Furthermore, when it is synchronized, the frequency $f_o$ of the signal s(t) produced at the electrode 50 becomes equal to $\alpha f_t$, where:

$f_t$ is the frequency of the signal received at the terminal 20, and

α is a rational number written in the form of a fraction M/P, where M and P are non-zero positive integers.

M can be a natural integer greater than or smaller than P. M and P can also be equal. P can be equal to 1.

At this stage, it will be noted that not all the values of α are possible. In reality, only certain particular values of α are possible. On this subject, the following article may be referred to:

Sergei Urazhdin and Phillip Tabor, "*Fractional synchronization of spin-torque nano-oscillators*", Physical Review Letters, PRL 105, 104101, 3 Sep. 2010.

The possible values of α are for example determined experimentally by causing the free frequency $f_{lo}$ to vary and by injecting, at the terminal 20, a frequency signal constantly equal to the frequency $f_t$. To modify the free frequency $f_{lo}$, it is possible to modify the intensity of the magnetic field $H_b$ and/or the intensity of the current $I_d$. This amounts here to modifying the intensity of the current $I_d$ and/or the intensity of the current $I_{cm}$. Indeed, it is known that the free frequency $f_{lo}$ depends on the intensity of the magnetic field $H_b$ which crosses the free layer and the intensity of the direct current $I_d$. For example, the free frequency $f_{lo}$ can be estimated by means of the following relationship:

$$\omega(H_b, I_d) = \omega_o(H_b) + Np(I_d) \quad (1),$$

where:

$\omega(H_b, I_d)$ is the pulsation of the free frequency $f_{lo}$, i.e. $2\pi f_{lo}$.

$\omega_o(H_b)$ is the pulse of the oscillator 22 caused by the magnetic field $H_b$, N is an experimentally determinable constant, and $p(I_d)$ is the amplitude of the oscillations of the signal s(t) as a function of the intensity of the current $I_d$.

The pulsation $\omega_o(H_b)$ can be given by Kittel's law. For example, when the magnetic field $H_b$ generated by the generator 70 is parallel to the axis of easiest magnetization of the free layer 46, then the pulsation $\omega_o(H_b)$ is given by the following relationship:

$$\omega_o(H_b) = (\gamma_o/2\pi)(H_b(H_b + 4\pi M_s))^{1/2} \quad (2),$$

where:

$\gamma_o$ is equal to about 2.82 MHz/Oe,

π is the symbol for "pi" radians, and $4\pi M_s$ is the magnetization at saturation (about 16000 Oe for a layer made of CoFeB).

The unit "Oe" is an oersted ($=10^3/(4\pi)$ A/m or about 80 A/m).

For example, by causing the intensity of the field $H_b$ to vary from 1 Oe to 5 kOe, the free frequency $f_{lo}$ is made to vary from 356 MHz to 29 GHz. Preferably, here, the field $H_b$ is made to vary from 50 Oe to 1.2 kOe, which corresponds to a variation of the free frequency $f_{lo}$ of 2 GHz to 13 GHz. In the case of the generator 70, the intensity of the magnetic field $H_b$ is modified by causing the intensity of the current $I_{cm}$ to vary.

The relationship (1), N is a constant in hertz which is proper to the magnetoresistive device 40. It can be determined experimentally. For example, the evolution of the free frequency $f_{lo}$ as a function of the intensity of the current $I_d$ for oscillations of the magnetization of the free layer in its plane is measured. From these measurements, the constant N can be computed. Typically, it is of the order of some GHz. For example, here $N/2\pi = 7.5$ GHz.

If the oscillations of the magnetization of the free layer are not included in its plane, the constant $N/2\pi$ is typically greater than 20 GHz.

Further explanation on the relationships linking the free frequency $f_{lo}$ to the different parameters of the magnetoresistive device can be found in the following article:

A. Slavin and V. Tiberkevich, "*Nonlinear auto-oscillator theory of microwave generation by spin-polarized current*" IEEE Transaction on Magnetics, vol no 45, pp. 1875-1918 (2009).

When the oscillator 22 is synchronized with the frequency $f_t$, then the quality factor of the oscillator 22 is better than when there is no synchronization. Typically, the quality factor of the oscillator 22 is a hundred times, or a thousand times or even $10^6$ times greater when it is synchronized than the quality factor when no signal is received through the terminal 20.

Furthermore, when the oscillator 22 is synchronized, the low-frequency noise, i.e. the power of the oscillations at frequencies below 1 GHz and preferably below a 100 Hz is very small. The term "very small" herein indicates the fact that the power of the low-frequency noise is at least ten times smaller than the power of the low-frequency noise measurable when there is no synchronization, i.e. when no signal is received at the terminal 20.

The above information can therefore be used to determine several possible values of α. Here below in the description, the values of α are only those for which a synchronization is possible. For the purpose of illustration, α is equal to ½; ¾; 1; 3/2; 5/2; 2; 3; 4 or 7/2 ou chosen in the group composed of ½; ¾; 3/2; 5/2; 2; 3; 4 and 7/2. It will also be noted that the value α=1 is always possible. Thus; if it is desired solely that the synchronized oscillator 22 should oscillate at the frequency $f_t$, then it is not necessary to determine the different possible values for α.

Here, the conditions of operation of the oscillator 22 are adjusted so that it is capable of getting automatically synchronized with the frequencies $f_1$, and alternately $f_2$, of the signal $I_{RF(t)}$. "Automatic synchronization" designates the fact that the oscillator 22 is capable of getting synchronized with the frequency $f_1$ and then with the frequency $f_2$ and vice versa without its being necessary in the meantime to modify the conditions of operation of this oscillator. The conditions of operation are defined as being the values of the intensity of the current $I_d$ and of the field $H_b$. In other words, the oscillator 22 must be capable of getting synchronized with the frequency $f_1$, and in alternation with the frequency $f_2$, without its being necessary to modify the current $I_d$ or the field $H_b$ each time when passing from the frequency $f_1$ to the frequency $f_2$ and inversely.

In this embodiment, it is desired that, when the oscillator 22 is synchronized with the frequencies $f_1$ and $f_2$, it should oscillate at the frequencies $\alpha f_1$ and $\alpha f_2$ respectively, with α being strictly greater than one and preferably greater than or equal to two or three. Preferably, α is chosen in the group composed of 3/2; 2; 5/2 and 3. α equal to two is fine. To this end, the current $I_d$ and the field $H_b$ are adjusted so that the free frequency $f_{lo}$ of oscillation is close at the same time to both $\alpha f_1$ and $\alpha f_2$. To this end, here the intensities of the current $I_d$ and $I_{cm}$ are adjusted so that the free frequency $f_{lo}$ is equal to $\alpha f_p$. The setting is done for example by:

fixing the intensity of the current $I_d$ just above the threshold $I_c$, and then determining, by means of the relationship (2), the magnetic field $H_b$ which makes it possible to obtain a free oscillation frequency equal to $\alpha f_p$, and finally determining the intensity of the current $I_{cm}$ used to obtain this field $H_b$ in the free layer 46.

The synchronization occurs only if the frequency $f_t$ belongs to a range $[f_p-\delta_p; f_p+\delta_p]$. In the present case, the width $2\delta_p$ of this range must be great enough to enable the oscillator 22 to get synchronized with the frequency $f_1$ and, alternately, with the frequency $f_2$. The width of this range increases when the amplitude of the electrical signal $I_{RF}(t)$ increases. Consequently, here, the amplifier of the block 12 is adjusted so that the frequencies $f_1$ and $f_2$ belong to the range $[f_p-\delta_p; f_p+\delta_p]$. For example, the amplitude of the signal $I_{RF}(t)$ is amplified till this amplitude corresponds to a magnetic field $H_a$ whose intensity within the free layer 46 is at least greater than 1 Oe and preferably greater than 10 Oe.

The operation of the demodulator 2 shall now be described in greater detail with reference to the method of FIG. 4.

Figure 4:
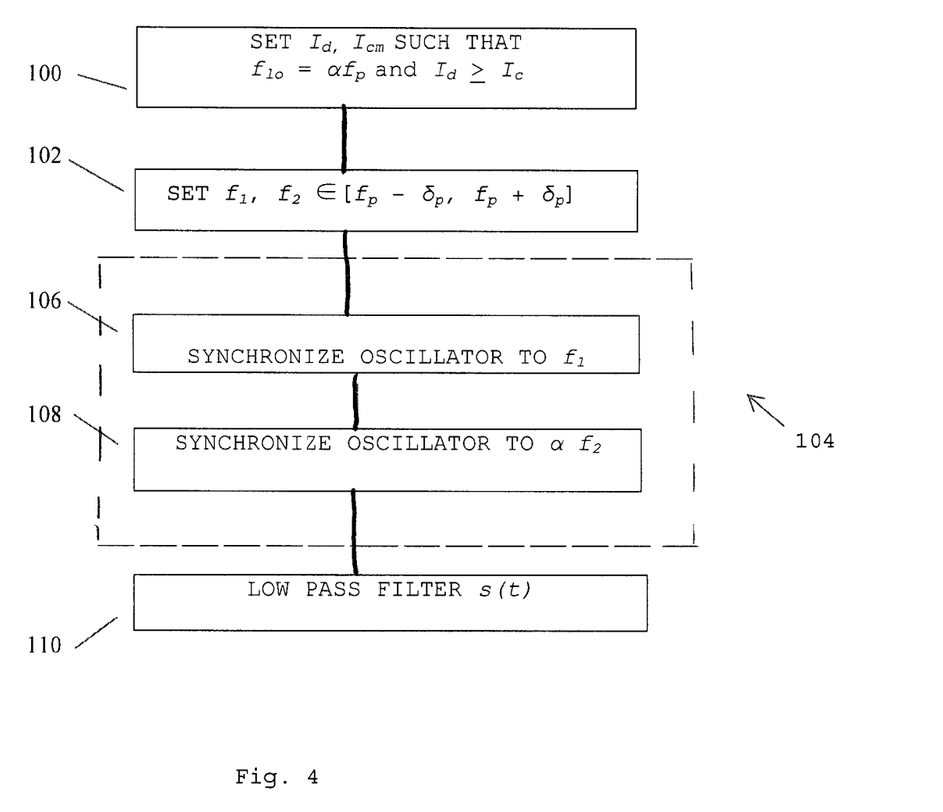
FIG. 4 is a flowchart of a method for demodulating by means of the demodulator of FIG. 1.

The method of FIG. 4 is described in the particular case where the modulation frequency $f_m$ is equal to 2 MHz, the depth of the modulation is equal to 200 MHz and the frequency $f_p$ of the carrier is equal to 10 GHz.

Initially, at a step 100, the intensities of the currents $I_d$ and $I_{cm}$ are set so that the free frequency $f_{lo}$ is equal to $\alpha f_p$. Furthermore, the intensity of the current $I_d$ is chosen to be greater than or equal to the intensity of the critical current $I_c$ so that the magnetoresistive device 40 oscillates.

At a step 102, the block 12 for shaping the signal $I_{RF}(t)$ is set so that the frequencies $f_1$ and $f_2$ belong to the range $[f_p-\delta_p; f_p+\delta_p]$.

Then, there starts a phase 104 during which the oscillator 22 receives the signal to be demodulated at the terminal 10, and renders the demodulated signal at the terminal 30. In this phase 104, the oscillator gets synchronized automatically and alternately with the frequencies $f_1$ and $f_2$ as a function of the information bit encoded on the signal $I_{RF}(t)$ received at the synchronization terminal 20.

More specifically, at a step 106, when the signal $I_{RF}(t)$ is at the frequency $f_1$, the oscillator 22 gets synchronized with this frequency and oscillates at the frequency $\alpha f_1$. This oscillation frequency $\alpha f_1$ corresponds to a given oscillation amplitude $p_1$. For example, the amplitude $p_1$ can be approximated by means of the following relationship: $p_1=\alpha|f_1-f_p|/N$, where |...| is the absolute value operation.

This amplitude $p_1$ of the signal s(t) corresponds to a resistance $R_1$ of the magnetoresistive device 40.

At a step 108, when the frequency of the signal $I_{RF}(t)$ is equal to the frequency $f_2$, the oscillator 22 gets synchronized and oscillates with a frequency $\alpha f_2$. In a manner similar to that described for the frequency $\alpha f_1$, this corresponds to an amplitude $p_2$ of oscillation approximated by the following relationship: $p_2=\alpha|f_2-f_p|/N$.

This amplitude $p_2$ corresponds to a resistance $R_2$ of the magnetoresistive device 40 different from the resistance $R_1$.

The signal s(t) produced at the output electrode 20 is therefore amplitude-modulated by the frequencies $f_1$ and $f_2$.

At a step 110, the signal s(t) is filtered by the low-pass filter 28. The low-pass filter 28 extracts only the low-frequency components of the oscillating signal s(t). This filtered oscillating signal is then transmitted to the terminal 30 as a frequency-demodulated signal.

More specifically, the difference in resistance between the step 106 and 108 is expressed by a DC voltage U at the output 29 of the filter 28 which is equal to $U_1$ when the oscillator 22 is synchronized with the frequency $f_1$, and with $U_2$ when the oscillator 22 is synchronized with the frequency $f_2$. The difference δU between the values $U_1$ and $U_2$ can be approximated by the following relationship: $\delta U=\delta R_{max}I_d|f_1-f_2|/N$, where $\delta R_{max}$ is the maximum variation of the resistance of the tunnel junction of the device 40.

For example, for a maximum variation $\delta R_{max}$ of 50Ω and with an intensity of the current $I_d$ of 1 mA, δU is in the range of a few mV.

Thus, the demodulator generates a logic signal which takes the value $U_1$ when a "0" bit is received and the value $U_2$ when a "1" bit is received.

Figure 5:
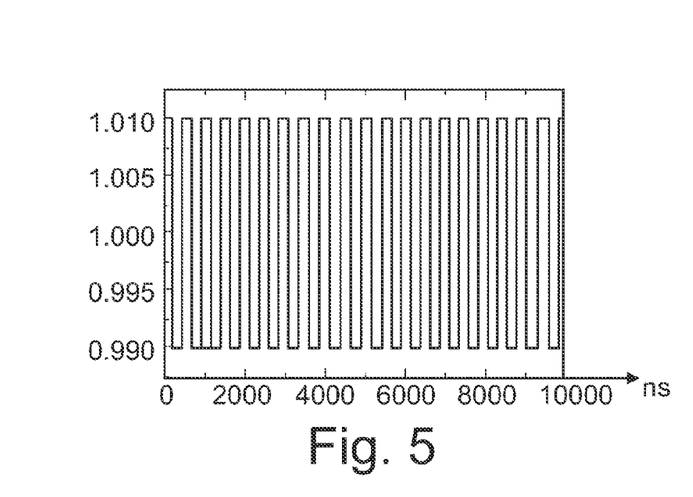
FIGS. 5 to 7 are timing diagrams illustrating different aspects of the modulated and demodulated electrical signals.
Figure 6:
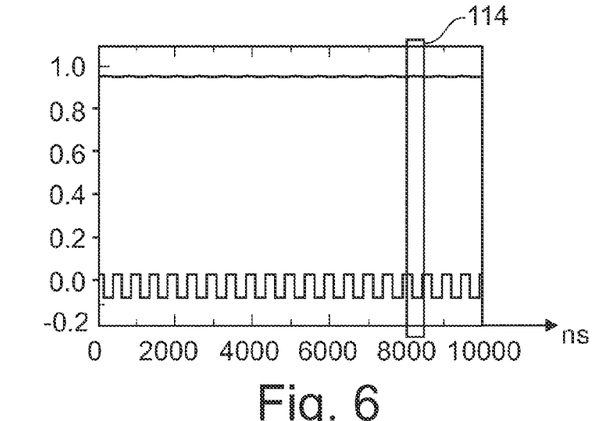
Figure 7:
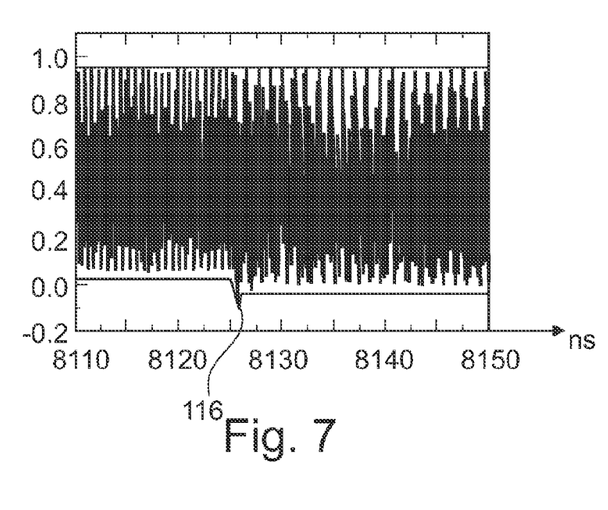

FIGS. 5 to 7 represent different graphs obtained by simulation of the operation of the demodulator 2.

The graph of FIG. 5 represents, as a function of time, the information bits encoded in the signal $I_{RF}(t)$. In this particular case, at each period $T_m$ the information bit to be transmitted changes its value.

The graph of FIG. 6 gives a view, as a function of time and on the same scale, of the evolution of the envelope of the signal s(t) produced by the oscillator 22 when this signal $I_{RF}(t)$ is received at the terminal 20. In FIG. 6, the square waves that appear at the bottom of the envelope are prompted by the variations in amplitude of the signal s(t) depending on whether it is synchronized with the frequency $f_1$ or with the frequency $f_2$.

In this FIG. 6, a frame 114 surrounds a portion of the signal s(t) which has been magnified in the graph of FIG. 7.

The graph of FIG. 7 gives a magnified view of the transition between a state in which the oscillator is synchronized with the frequency $f_1$ to another state in which the oscillator is synchronized with the frequency $f_2$. The black curve 116 illustrates the fact that the variation in amplitude during a change in the information encoded in the signal $I_{RF}(t)$ does not occur instantaneously. Indeed, the passage from the amplitude $p_1$ to the amplitude $p_2$ is done along a curve the envelope of which varies exponentially in $e^{-t/\tau_c}$, where t is the time and $\Gamma_c$ is the rate of relaxation of amplitude of the magnetoresistive device 40. $\Gamma_c$ is a rate of variation expressed in hertz. The fact that the modification of the amplitude does not occur instantaneously shows that the frequency of modulation $f_m$ has to be strictly lower than this frequency $\Gamma_c$. It has been measured experimentally that the frequency $\Gamma_c$ ranges from 50 MHz to 50 GHz and typically from 100 MHz to 10 GHz. Thus, the information bit rate ranges from 50 Mbit/s to 10 or 50 Gbit/s.

Figure 8:
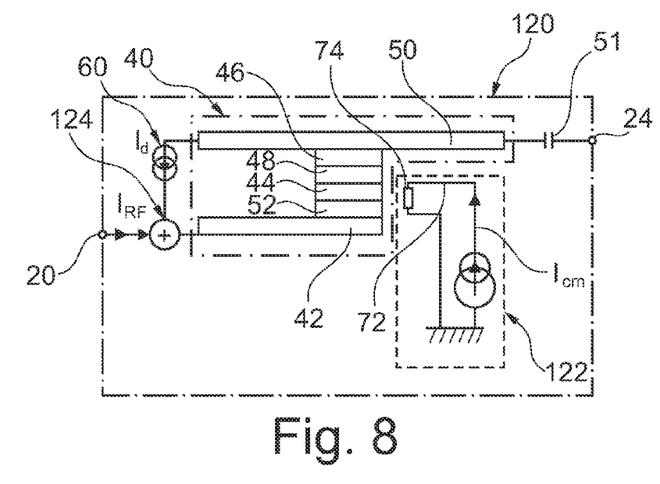
FIG. 8 is another embodiment of a radiofrequency oscillator that can be used in the demodulator of FIG. 1.

FIG. 8 shows an oscillator 120 capable of being used instead of the oscillator 22. This oscillator 120 is identical to the oscillator 22 except that the generator 70 is replaced by a generator 122 and the generator 60 is connected to the input electrode 42 by means of a summing element 124.

The generator 122 is identical to the generator 70 except that the summing element 80 is omitted. Thus, in this embodiment, the synchronization with the signal $I_{RF}(t)$ is not done by means of an alternating magnetic field. In this embodiment, the magnetic field $H_b$ is constant.

The summing element 124 possesses one input directly connected to the output of the direct current generator 60 and another input directly connected to the synchronization terminal 20. One output of this summing element 124 is directly connected to the electrode 42. Consequently, this summing element 124 adds the signal $I_{RF}(t)$ to the direct current $I_d$. Thus, when the oscillator 120 is used instead of the oscillator 22, the synchronization of the frequency of the oscillator with the frequencies $f_1$ and, alternately, $f_2$ is done by injecting the electrical signal $I_{RF}(t)$ into the electrode 42.

The working of the demodulator 2 when it is equipped with the oscillator 120 can be deduced from the explanations that have been given here above in the case of the oscillator 22. In particular, for the synchronization of the oscillator 120 with the frequencies $f_1$ and $f_2$ to take place, it is necessary to adjust the intensities of the current $I_d$ and $I_{cm}$ as described here above. It is also necessary that the amplitude of the current $I_{RF}(t)$ should not be negligible as compared with intensity of the current $I_d$. To this end, the block 12 is adjusted so that the amplitude of the current $I_{RF}(t)$ is at least greater than 10% and preferably greater than 30% or 50% of the intensity of the current $I_d$.

Many other embodiments are possible. For example, the information can be encoded in the signal $I_{RF}(t)$ not by means of two frequencies only, but by means of more than two frequencies. A modulation of this kind using more than two frequencies is also known as MFSK (Multiple Frequency Shift Keying). In this case, the oscillator has to be adjusted so that it can get synchronized with each of the frequencies encoding a piece of information. In other words, what has been described here for two frequencies also works for n frequencies with n greater than or equal to two.

The generator of the magnetic field $H_b$ can be distinct from the one that generates the field $H_a$.

It is not necessary for the free frequency $f_{lo}$ to be strictly equal to $\alpha f_p$. As a variant, the intensities of the currents $I_{cm}$ and $I_d$ are adjusted so that the frequency $f_{lo}$ is equal to the frequency $\alpha f_p$ to within plus or minus 60% and preferably to within plus or minus 45% or 30% or 10%. Advantageously, the intensities of the currents $I_d$ and $I_{cm}$ are adjusted so that the free frequency $f_{lo}$ belong the range $[\alpha f_1; \alpha f_2]$ where the frequencies $f_1$ and $f_2$ are respectively the lowest and the highest frequencies used in the frequency modulation to encode respective pieces of information.

Many other embodiments of the magnetoresistive device 40 are possible. For example, the direction of easiest magnetization of the free layer and/or the reference layer are not necessarily contained in the plane of the layer. For example, the direction of easiest magnetization can be perpendicular to the plane of the layer.

It is also possible for the layer 44 to be a multilayer, for example an SyF (synthetic ferrimagnetic) or even an SAF (synthetic antiferromagnetic) multilayer. This makes it possible to trap the direction of magnetization of this layer without its being necessary to use a complementary anti-ferromagnetic layer for this. The layer 52 can therefore be omitted in this case.

The spacer 48 can be made out of an electrically conductive material such as copper (Cu). The magnetoresistive properties of the pillar are then called giant magnetoresistance or GMR properties.

One (or more) polarizers can also be used to make the magnetoresistive device in addition to the reference layer. A polarizer is a magnetic layer or multilayer, the magnetization of which is outside the plane of the layer and, for example, perpendicular to the plane of the layer. The polarizer makes it possible to spin-polarize the current that crosses it. Typically, the polarizer is formed by several sub-layers superimposed on one another, for example an alternation of magnetic and metallic layers (for example $(Co/Pt)_n$). Here, the polarizer is not described in greater detail. For further information on polarizers, reference may be made to the patent application FR2 817 998. The presence of the polarizer makes it possible to obtain a precession of the magnetization of the free layer outside its plane. This enables making the oscillator work in a null field, i.e. in the absence of any static external magnetic field. For example, a polarizer is directly deposited on the electrode 42. Thus, in the embodiment of FIG. 8, the magnetic field generator 122 can be omitted, for example if a polarizer is used.

The magnetic field generator 70 can be made differently. For example, the magnetic field $H_b$ can be generated by a magnetized layer situated in proximity to the free layer.

The magnetic field $H_b$ can be parallel or perpendicular to the direction of easiest magnetization of the free layer. It can also form any unspecified angle with this direction of easiest magnetization. The choice of this angle modifies the possible values of the coefficient $\alpha$.

The embodiments of FIGS. 3 and 8 can be combined. Thus, the signal $I_{RF}(t)$ can be injected at the same time into the summing elements 80 and 124.

The invention claimed is:

1. An apparatus comprising a demodulator of an electrical signal frequency-modulated about a carrier frequency with a modulation frequency, said demodulator comprising an acquisition terminal for receiving the frequency-modulated signal, a rendering terminal for rendering the frequency-demodulated electrical signal, a radiofrequency oscillator comprising a magnetoresistive device within which there flows a spin-polarized electrical current to produce an oscillating signal at an output electrode, the magnetoresistive device being formed by a stack of magnetic layers and non-magnetic layers, the layers having a resistance whose amplitude varies as a function of frequency of the oscillating signal at the output electrode, at least one of a current source to cause a continuous current of electrons to flow perpendicularly through said layers and a magnetic field generator configured for generating a continuous magnetic field, field lines of which cross a free layer of the magnetoresistive device with an intensity greater than or equal to 1 Oersted, the at least one of a current source and a continuous magnetic field generator being set so that, under identical conditions of operation, the radiofrequency oscillator is synchronized with oscillations at a first frequency and, in alternation, with oscillations at a second frequency, where the first and second frequencies are used in the frequency-modulated signal to encode respective pieces of information, and a synchronization terminal for synchronizing the frequency of the oscillating signal with the frequency of the signal received at the synchronization terminal, the synchronization terminal being connected to the acquisition terminal, and a low-pass filter having a −3 dB cut-off frequency that is strictly lower than the carrier frequency and higher than the modulation frequency, said low-pass filter being connected to the output electrode of the magnetoresistive device to filter the oscillating signal, and to the rendering terminal to provide, as a demodulated electrical signal, the filtered signal, the low-pass filter.

2. The apparatus of claim 1, wherein the magnetoresistive device comprises: an input electrode by which a direct electrical current is injected, a reference layer for spin-polarizing the electrical current, the reference layer having a magnetization having a fixed direction, wherein the magnetization of the free layer can oscillate when the free layer is crossed by the spin-polarized current, a non-magnetic spacer layer interposed between the reference layer and the free layer to form one of a tunnel junction and a spin valve, a cross-section of at least one of the layers of the stack having a diameter of less than 300 nanometers, and wherein at the output electrode, there is produced a signal oscillating at an oscillating frequency as a function of one of an intensity of the direct current and an amplitude of the continuous magnetic field, field lines of which cross the free layer.

3. The apparatus of claim 1, wherein the radiofrequency oscillator is configured to produce a signal oscillating at a scaled first frequency when the oscillator is synchronized with oscillations at the first frequency and to produce a signal oscillating at a scaled second frequency when the oscillator is synchronized with oscillations at the second frequency, wherein the first and second scaled frequencies are obtained by scaling the first and second frequencies by a scale factor that is strictly greater than one.

4. The apparatus of claim 1, wherein the radiofrequency oscillator comprises a magnetic field generator equipped with the synchronization terminal, the magnetic field generator being configured for generating an alternating magnetic field having a frequency that is a function of the frequency of the signal received at the synchronization terminal, and wherein the alternating magnetic field comprises field lines that cross the free layer so that the frequency of the oscillating signal is synchronized with the frequency of the signal received at the synchronization terminal.

5. The apparatus of claim 2, wherein the radiofrequency oscillator comprises a summing element equipped with the synchronization terminal, the summing element being configured for adding the electrical signal received at the synchronization terminal to the direct current that perpendicularly crosses the layers so that the frequency of the oscillating signal is synchronized with the frequency of the signal received at the synchronization terminal.

6. A method for demodulating an electrical signal frequency-modulated about a carrier signal having a carrier frequency and a modulation frequency, the method comprising receiving the modulated electrical signal at an acquisition terminal, rendering the demodulated signal at a rendering terminal, synchronizing a radiofrequency oscillator, under identical conditions of operation, with oscillations at a first frequency and, in alternation, with oscillations at a second frequency, wherein the first and second frequencies are frequencies used in the frequency-modulated signal to encode respective pieces of information, the radiofrequency oscillator comprising a magnetoresistive device within which there flows a spin-polarized electrical current to produce an oscillating signal at an output electrode, the magnetoresistive device being formed by a stack of magnetic layers and non-magnetic layers, the layers having a resistance whose amplitude varies as a function of the frequency of the oscillating signal at the output electrode, at least one of a current source to cause a continuous current of electrons to flow perpendicularly through the layers and a magnetic field generator configured for generating a continuous magnetic field, field lines of which cross a free layer of the magnetoresistive device with an intensity greater than or equal to 1 Oersted, the at least one of a current source and a continuous magnetic field generator being set so that, under identical conditions of operation, the radiofrequency oscillator is synchronized with oscillations at a first frequency and, in alternation, with oscillations at a second frequency, and a synchronization terminal for synchronizing the frequency of the oscillating signal with the frequency of the signal received at the synchronization terminal, the synchronization terminal being connected to the acquisition terminal, filtering, using a low-pass filter having a −3 dB cut-off frequency that is strictly lower than the carrier frequency and higher than the modulation frequency, the oscillating signal generated at the output electrode, and providing the filtered signal to the rendering terminal as a demodulated electrical signal.

7. The method of claim 6, wherein the direct continuous current and/or a continuous magnetic field are set so that a free frequency of oscillation of the oscillation signal produced in the absence of a signal at the synchronization terminal is between first and second scaled frequencies, where the first and second frequencies are respectively the lowest and the highest of the frequencies used in the frequency-modulated signal to encode a piece of information, and wherein the first and second scaled frequencies are obtained by scaling the first and second frequencies by a rational number.

8. The method of claim 7, further comprising amplifying the frequency-modulated electrical signal so that an extent of the range, about the carrier frequency, of the frequencies with which the radiofrequency oscillator is synchronized is strictly greater than an absolute value of a difference between the first and second frequencies.

9. The method of claim 8, further comprising amplifying the frequency-modulated electrical signal to have an amplitude at the synchronization terminal that is greater than 10% of the intensity of the direct continuous current or that corresponds to an alternating magnetic field, the intensity of which is greater than 1 Oersted within the free layer when converted into a magnetic field by a generator.

10. The method of claim 6, wherein the modulation frequency is strictly lower than a frequency corresponding to a rate of relaxation of amplitude of the magnetoresistive device.

* * * * *

UNITED STATES PATENT AND TRADEMARK OFFICE
CERTIFICATE OF CORRECTION

| | | |
|---|---|---|
| PATENT NO. | : 8,655,302 B2 | Page 1 of 1 |
| APPLICATION NO. | : 13/449644 | |
| DATED | : February 18, 2014 | |
| INVENTOR(S) | : Michael Quinsat et al. | |

It is certified that error appears in the above-identified patent and that said Letters Patent is hereby corrected as shown below:

In the Claims:

In column 16, claim 9, line 53, the word "direct" should be deleted.

Signed and Sealed this
First Day of July, 2014

Michelle K. Lee
*Deputy Director of the United States Patent and Trademark Office*